United States Patent
Fu et al.

(10) Patent No.: US 9,038,972 B2
(45) Date of Patent: May 26, 2015

(54) TILT MECHANISM FOR A MONITOR

(71) Applicant: Ergotron, Inc., Eagan, MN (US)

(72) Inventors: Xiao Iong Fu, Dongguan (CN); Shaun C. Lindblad, Lino Lakes, MN (US)

(73) Assignee: Ergotron, Inc., St. Paul, MN (US)

(*) Notice: Subject to any disclaimer, the term of this patent is extended or adjusted under 35 U.S.C. 154(b) by 0 days.

(21) Appl. No.: 13/954,114

(22) Filed: Jul. 30, 2013

(65) Prior Publication Data

US 2014/0029231 A1   Jan. 30, 2014

Related U.S. Application Data (60) Provisional application No. 61/677,209, filed on Jul. 30, 2012.

(51) Int. Cl.
| | | |
|---|---|---|
| *G06F 1/16* | (2006.01) | |
| *H05K 7/16* | (2006.01) | |
| *F16M 11/10* | (2006.01) | |
| *F16M 11/20* | (2006.01) | |

(52) U.S. Cl.
  CPC ............... *H05K 7/16* (2013.01); *F16M 11/10* (2013.01); *F16M 11/2021* (2013.01); *F16M 2200/041* (2013.01); *F16M 2200/044* (2013.01); *Y10S 248/917* (2013.01); *Y10S 248/923* (2013.01)

(58) Field of Classification Search
  USPC ..................................................... 361/679.06
  See application file for complete search history.

(56) References Cited

U.S. PATENT DOCUMENTS

| 4,708,313 A | 11/1987 | Freni | |
|---|---|---|---|
| 6,822,857 B2 | 11/2004 | Jung et al. | |
| 7,198,237 B2 | 4/2007 | Cho et al. | |
| 7,770,856 B2 | 8/2010 | Depay | |
| 2004/0226138 A1 | 11/2004 | Harmon | |
| 2006/0101619 A1 | 5/2006 | Tai | |
| 2007/0262210 A1* | 11/2007 | Oh et al. ................... 248/125.1 |
| 2011/0317338 A1* | 12/2011 | Chen et al. .............. 361/679.01 |
| 2012/0079682 A1* | 4/2012 | Cheng ............................ 16/252 |

FOREIGN PATENT DOCUMENTS

| EP | 1626222 A2 | 2/2006 |
|---|---|---|
| EP | 1785661 A2 | 5/2007 |
| WO | 8101872 A1 | 7/1981 |
| WO | WO-2014022352 A1 | 2/2014 |

OTHER PUBLICATIONS

PCT International Search Report and Written Opinion dated Nov. 7, 2013 for PCT/US2013/052660, 9 pages.

* cited by examiner

*Primary Examiner* — Anthony Q Edwards
(74) *Attorney, Agent, or Firm* — Schwegman Lundberg & Woessner, P.A.

(57) ABSTRACT

A tilt mechanism for an electronic display. A tilt mechanism including a counterbalancing mechanism having a compression spring assembly. Such tilt mechanism allowing an electronic display to be positioned at a variety of tilt angles. A tilt mechanism including a support that is pivotable with respect to a support surface.

13 Claims, 10 Drawing Sheets

TILT MECHANISM FOR A MONITOR

RELATED APPLICATIONS

This application claims the benefit of U.S. Provisional Application No. 61/677,209, filed Jul. 30, 2012, the contents of which are hereby incorporated by reference in its entirety.

FIELD

The invention generally relates to systems and methods for tilt mechanisms for electronic monitors.

BACKGROUND

Tilt mechanisms are used to adjust a tilt angle of an electronic monitor for ergonomic viewing by a user.

SUMMARY

Embodiments of the invention include a tilt mechanism for an electronic display. In some embodiments, the tilt mechanism includes a counterbalancing mechanism having a compression spring assembly. In certain embodiments, such a compression spring allows for a thinner tilt mechanism compared to counterbalancing mechanisms having torsion spring assemblies. Such tilt mechanisms can be carried by stands, arms, carts, and the like.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the present invention will hereinafter be described in conjunction with the appended drawings, wherein like numerals denote like elements.

DETAILED DESCRIPTION OF THE PREFERRED EMBODIMENTS

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

As shown in FIGS. 1A-10B, some embodiments include a tilt mechanism 10 with a counterbalancing mechanism useful for counterbalancing a monitor 20 (sometimes referred to herein as a display, only a rear panel of which is shown in the figures). The monitor can be supported by a monitor mounting bracket 30 (e.g., a VESA compliant bracket) associated with a tilt bracket 34 (e.g. connected to or formed integrally with) that is tiltable across a range of tilt angles (e.g., about a generally horizontal axis of rotation). The monitor 20 has a monitor weight acting a first distance from the tilt axis of rotation TAR. In such embodiments, a monitor torque MT is created by the weight of the monitor times the horizontal distance between the monitor's center of gravity CG and the tilt axis of rotation TAR.

Figure 2A:
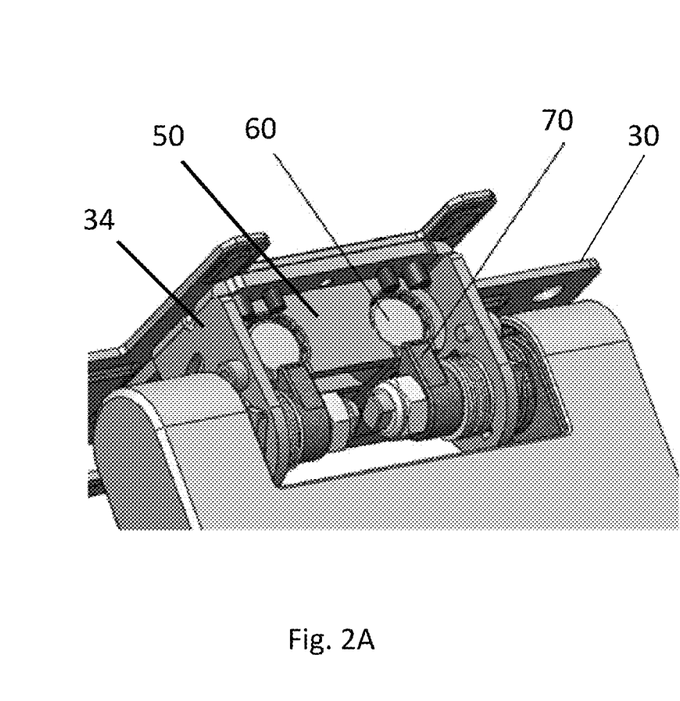
FIG. 2A includes a perspective view of a tilt mechanism in accordance with an embodiment of the invention.
Figure 2B:
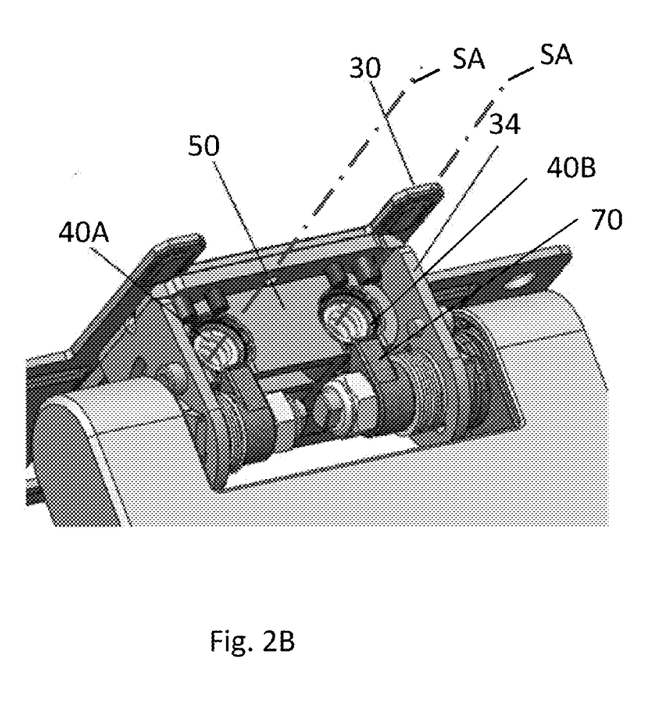
FIG. 2B includes a perspective plan view of a tilt mechanism in accordance with an embodiment of the invention.

The counterbalancing mechanism can include at least one compression spring 40. The compression spring 40 includes a first end 42 and a second end 44. The compression spring 40 can include multiple coils 46 wound about a spring axis SA. Turning to FIGS. 2A and 2B, the illustrated embodiment includes a first compression spring 40A and a second compression spring 40B. In the illustrated embodiment, the first and second spring axes of the first and second compression springs 40A and 40B are parallel to each other. The first end 42 of the compression spring 40 is in contact with a spring cap 60. The compression spring 40 is acted against by the spring cap 60 when the tilt bracket 34 is rotated during tilt angle adjustment. During this rotation, the compression spring 40 moves from a relatively uncompressed position to a relatively compressed position. The compression spring 40 moves a spring deflection distance between the relatively uncompressed position and the relatively compressed position along the spring axis SA. The movement is accompanied by a compression force acting at a second distance SD from the tilt axis of rotation TAR (shown in enlarged detail in FIG. 1B). The compression spring 40 is characterized by a force response wherein the compression force increases as the deflection distance decreases. In some embodiments, the spring distance SD is fixed during a tilting operation. A spring torque ST is created by the compression force acting at the spring distance SD.

Figure 1A:
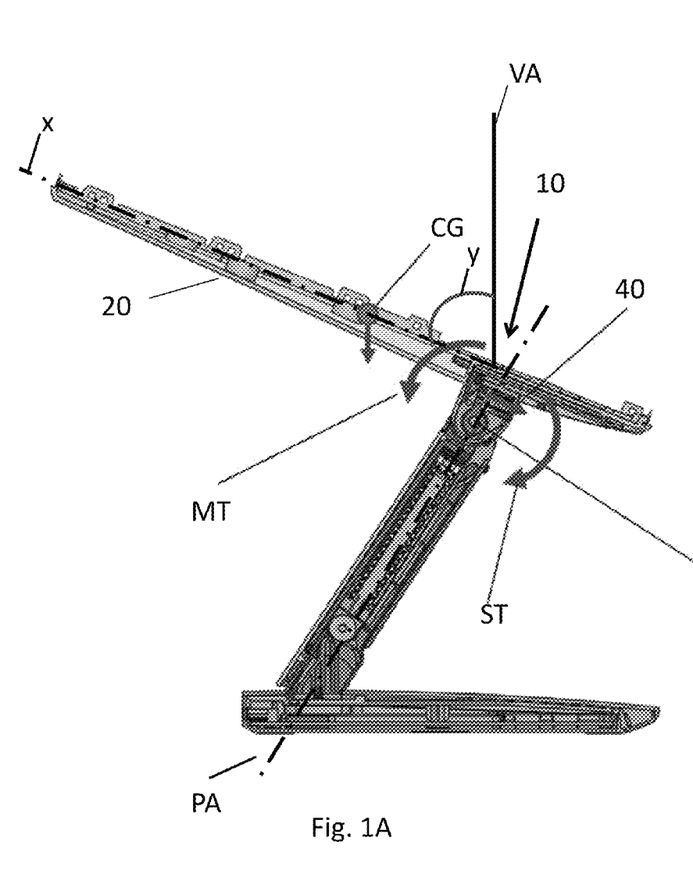
FIG. 1A includes a sectional side plan view of a stand with a tilt mechanism in accordance with an embodiment of the invention.
Figure 1B:
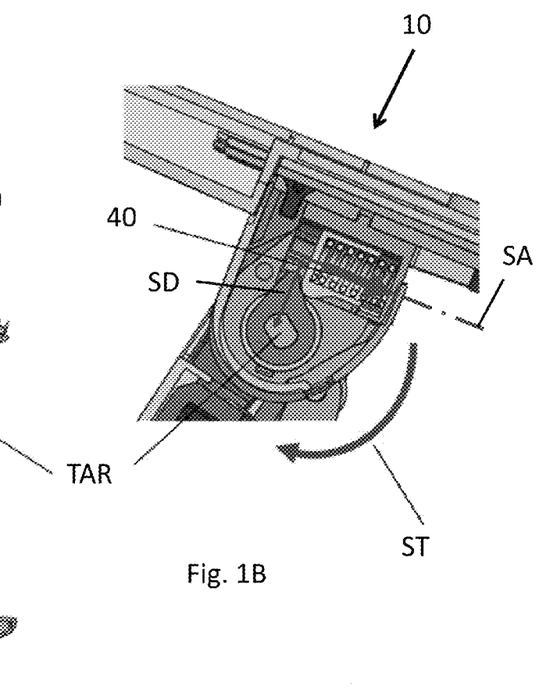
FIG. 1B includes an enlarged view of a portion of FIG. 1A.

As shown in FIG. 1A, the monitor torque MT and the spring torque ST act in opposing directions and, in some embodiments, counterbalance each other. In such embodiments, as the monitor is tilted backwards (such that the monitor would be positioned more horizontally) the horizontal distance between the monitor's CG and the tilt axis of rotation TAR increases, thereby increasing the monitor torque MT. During the same movement, the compression spring 40 is compressed, thereby increasing the compression force and, in turn, the spring torque ST. According, such embodiments are counterbalanced at any tilt angle within a range of tilt angles. It is to be understood in such an embodiment, there may be some friction acting at various locations in the tilt mechanism 10 causing the compression spring 40 to not perfectly counterbalance the weight of the monitor. Accordingly, the terminology "counterbalanced" includes embodiments where friction or similar means may allow the compression spring to not perfectly counterbalance the weight of the monitor 20 on its own, yet where the monitor stays in its adjusted position.

Figure 3A:
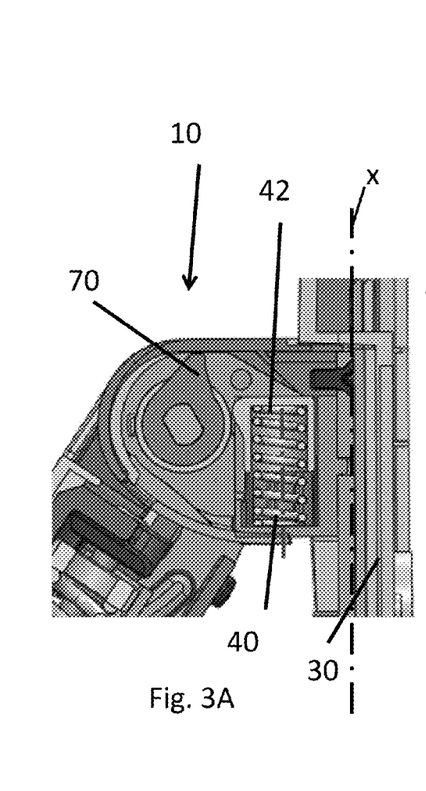
FIG. 3A includes a sectional side plan view of a tilt mechanism at a first tilt angle in accordance with an embodiment of the invention.
Figure 3B:
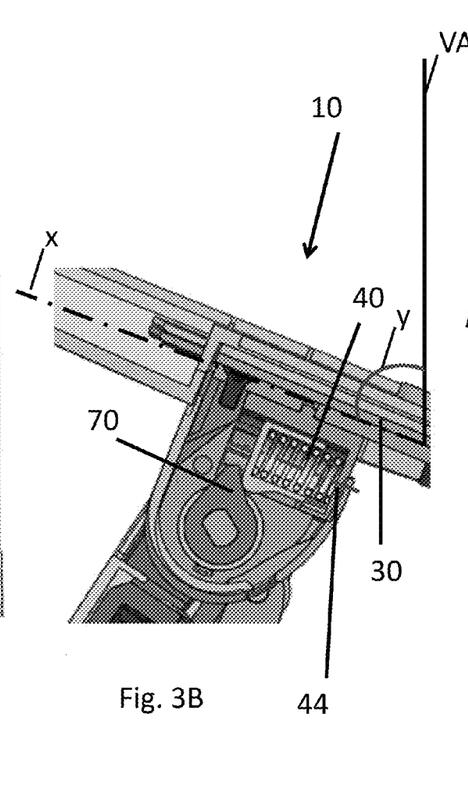
FIG. 3B includes a sectional side plan view of a tilt mechanism at a second tilt angle in accordance with an embodiment of the invention.
Figure 3C:
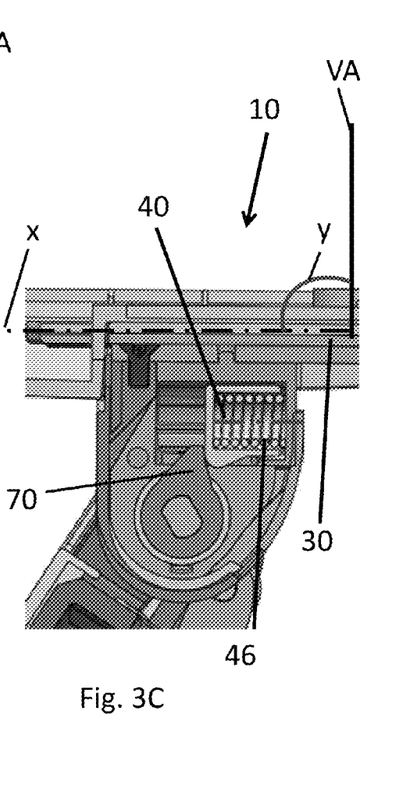
FIG. 3C includes a sectional side plan view of a tilt mechanism at a third tilt angle in accordance with an embodiment of the invention.

In some embodiments, the tilt mechanism 10 is tiltable within a range of tilt angles. The tilt angle "y" can be defined as the angle between a vertical axis VA and a line "x" passing through the CG of the monitor as illustrated in FIGS. 3A-3C. In some embodiments, the range of tilt angles "y" can be between approximately −15 degrees and 90 degrees. A tilt angle "y" of 0 degrees corresponds to a vertical position of the monitor, as shown in FIG. 3A. A positive tilt angle corresponds to counter-clockwise rotation of the monitor away from the vertical position in the illustrated embodiments, FIGS. 3B and 3C. FIG. 3B shows the monitor tilted at a positive tilt angle. FIG. 3C shows the monitor at its maximum positive tilt angle which, in this embodiment, is generally horizontal. The tilt mechanism is tiltable to negative tilt angles (not shown). A negative tilt angle corresponds to clockwise rotation away from the vertical position of the tilt mechanism shown in FIG. 3A.

In some embodiments, the compression spring 40 allows for a thinner tilt mechanism compared to mechanisms having a torsion spring. For example, in some embodiments the spring axis SA can be different than the tilt axis of rotation TAR. In some embodiments, the spring axis SA can be non-parallel with the tilt axis of rotation TAR. For example, the spring axis SA may be skewed relative to the tilt axis of rotation TAR. In the embodiment shown, the spring axis SA is perpendicular to the tilt axis of rotation TAR. In addition, the spring axis SA may be offset from the tilt axis of rotation TAR. Such an arrangement generally allows the tilt mechanism to be thinner than a tilt mechanism incorporating a torsion spring, as the torsion spring axis must be aligned with (i.e., parallel to) the tilt axis.

FIGS. 2A-B show perspective views of the some details of an embodiment of the tilt mechanism 10. As shown, the compression springs 40 are restrained by a spring holder bracket 50 and act against respective spring caps 60. In this embodiment, the spring holder bracket 50 is operatively connected (directly, or indirectly via a tilt bracket 34) to the monitor attachment bracket 30, such that the compression springs 40 rotate along with the monitor attachment bracket 30 during tilt angle adjustment. The compression springs 40 act against (e.g., via the spring end caps 60), a compression bracket 70, which remains stationary during tilt adjustment. In some embodiments, the angular position of the compression bracket 70 is fixed with respect to a support, such as a stand, arm, or cart. In the embodiment shown, as the monitor attachment bracket 30 is tilted to position a monitor in a more horizontal orientation, the compression springs 40 are acted against the compression bracket 70 and the spring deflection distance of the compression springs 40 decrease, thereby increasing the compression force. The increasing compression force results in a higher spring torque ST.

FIGS. 3A-C show side plan sectional views of an embodiment of the tilt mechanism 10 in three exemplary tilt positions. In FIG. 3A, the tilt angle is 0 degrees (e.g., the monitor attachment bracket 30 is generally vertical). At such an angle, the monitor's CG is in front of the tilt axis of rotation. Accordingly, as shown, no compression force is required to hold the monitor in this position, and the compression springs 40 are not acting against the compression bracket 70. Similarly, it should be noted that in some embodiments the monitor can be tilted forward, such that its tilt angle is negative (e.g., −15 degrees or more). In FIG. 3B, the tilt angle is approximately 70 degrees. The compression springs 40 act against the compression bracket 70 and the spring torque balances the monitor torque. In FIG. 3C, the tilt angle is approximately 90 degrees (i.e., the monitor attachment bracket 30 is approximately horizontal). Here, the compression spring 40 is at maximum compression to create a maximum compression force and spring torque to balance the maximum monitor torque.

Figure 4A:
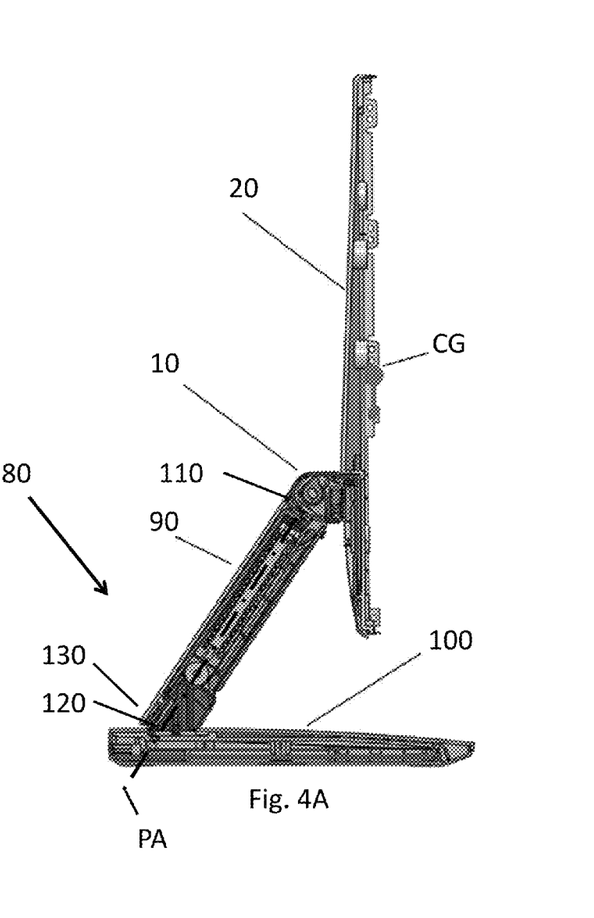
FIG. 4A includes a sectional side plan view of a stand with a tilt mechanism at a first tilt angle in accordance with an embodiment of the invention.
Figure 4B:
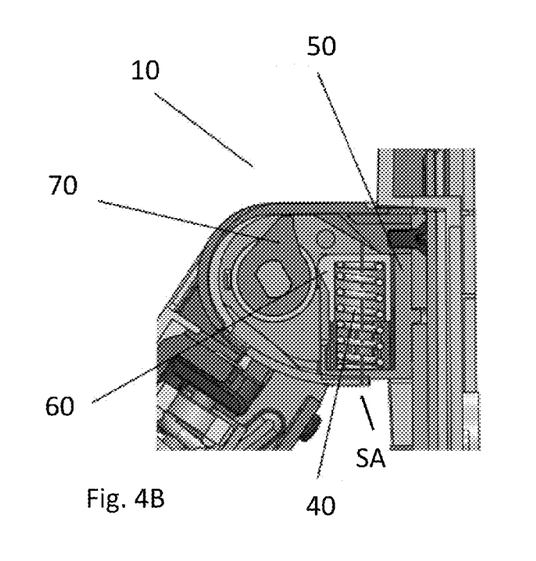
FIG. 4B includes an enlarged view of a portion of FIG. 4A.

FIG. 4A shows a support including a stand 80 incorporating an embodiment of the tilt mechanism 10. As shown, the stand 80 includes a riser 90 and a base 100. The riser 90 can have a distal end 110 connected to a monitor via the tilt mechanism 10. In some embodiments the riser 90 is pivotable with respect to the base 100 about a base pivot 120 near its proximal end 130. The riser can also house a counterbalance mechanism, such as a spring (as shown in FIG. 4A) to balance the angular position of the riser with respect to the base. In some embodiments, the riser 90 can be pivoted about the base pivot 130 between about 0 degrees (when it is generally horizontal and in apposition to the base) and about 90 degrees (when it is generally vertical). In FIG. 4A, the tilt angle is 0 degrees (e.g., the monitor 20 and monitor attachment bracket are generally vertical) and the monitor's CG is in front of the tilt axis. Accordingly, as shown, in FIG. 4B, no compression force is required to hold the monitor in this position, and the compression springs 40 are not acting against the compression bracket 70.

Figure 5A:
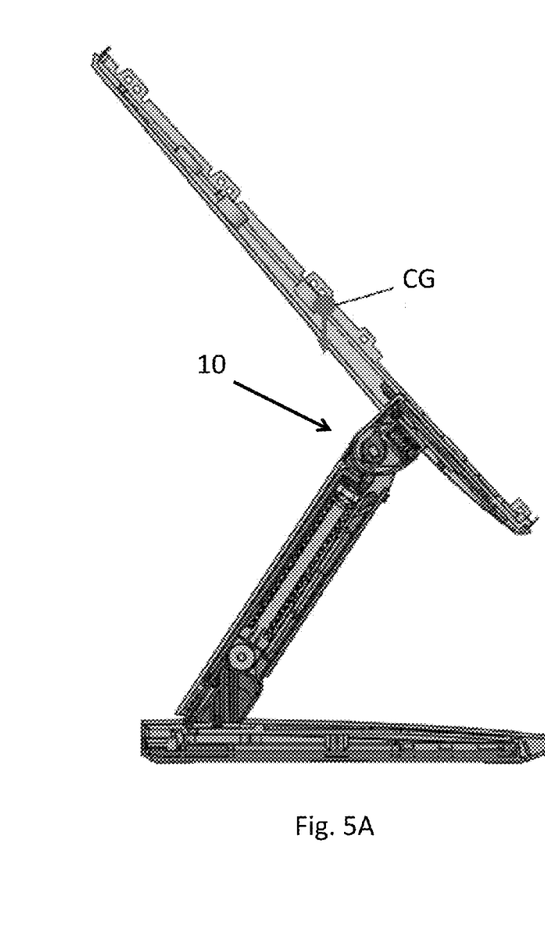
FIG. 5A includes a sectional side plan view of a stand with a tilt mechanism at a second tilt angle in accordance with an embodiment of the invention.
Figure 5B:
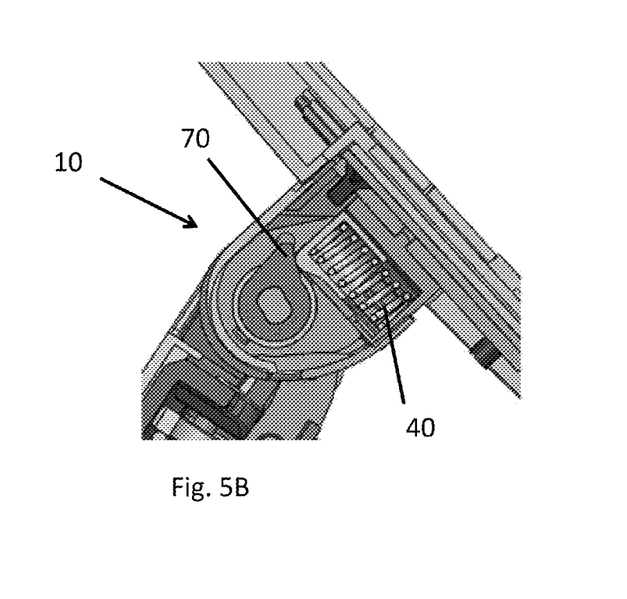
FIG. 5B includes an enlarged view of a portion of FIG. 5A.

In FIG. 5A, the tilt angle of the tilt mechanism 10 on the stand is approximately 40 degrees. As shown in FIG. 5B, the compression springs 40 are acting against the compression bracket 70 (via the spring caps) to create a spring torque ST to balance the monitor torque MT.

Figure 6A:
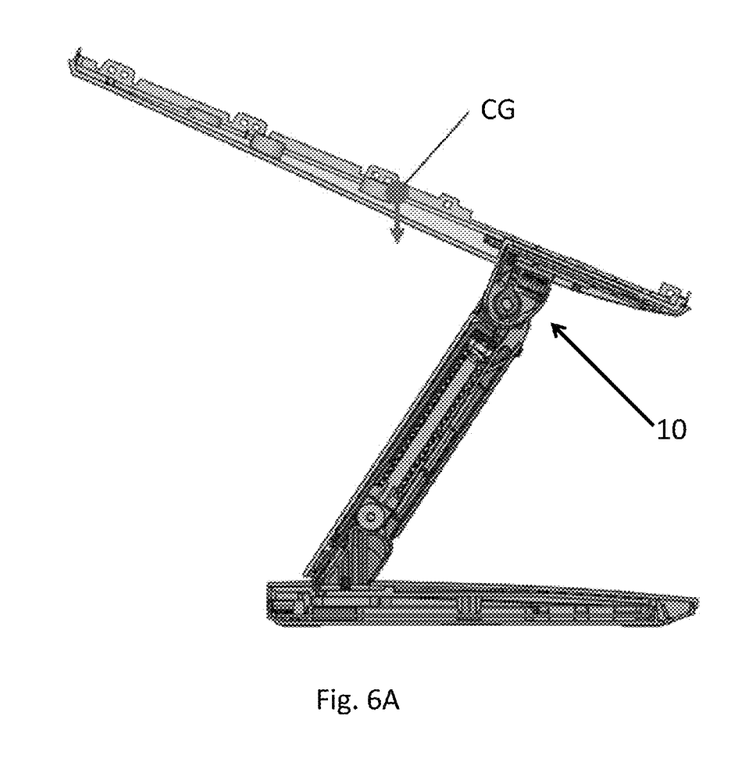
FIG. 6A includes a sectional side plan view of a stand with a tilt mechanism at a third tilt angle in accordance with an embodiment of the invention.
Figure 6B:
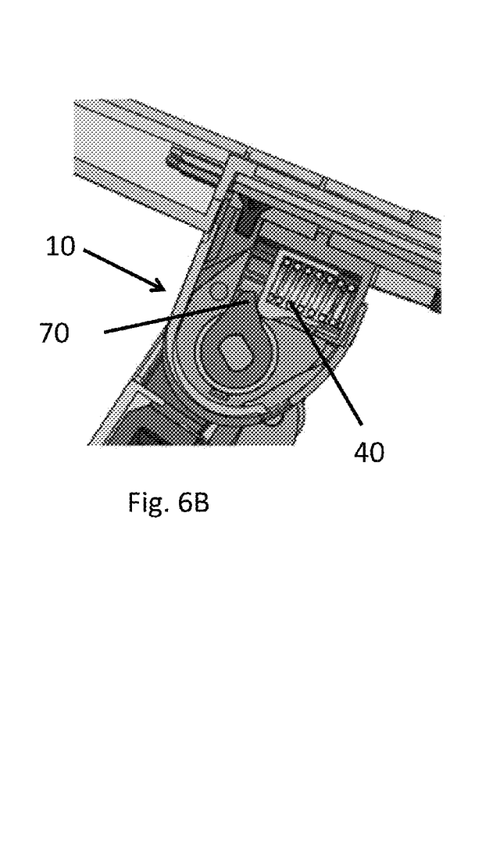
FIG. 6B includes an enlarged view of a portion of FIG. 6A.

In FIG. 6A, the tilt angle of the tilt mechanism 10 on the stand is approximately 70 degrees. As shown in FIG. 6B, the compression spring 40 is further compressed compared to FIG. 5B, such that a greater compression force is created, thereby producing a greater spring torque to balance the greater monitor torque (as the horizontal distance between the monitor's CG and the tilt axis has also increased related to the position shown in FIG. 5A).

Figure 7A:
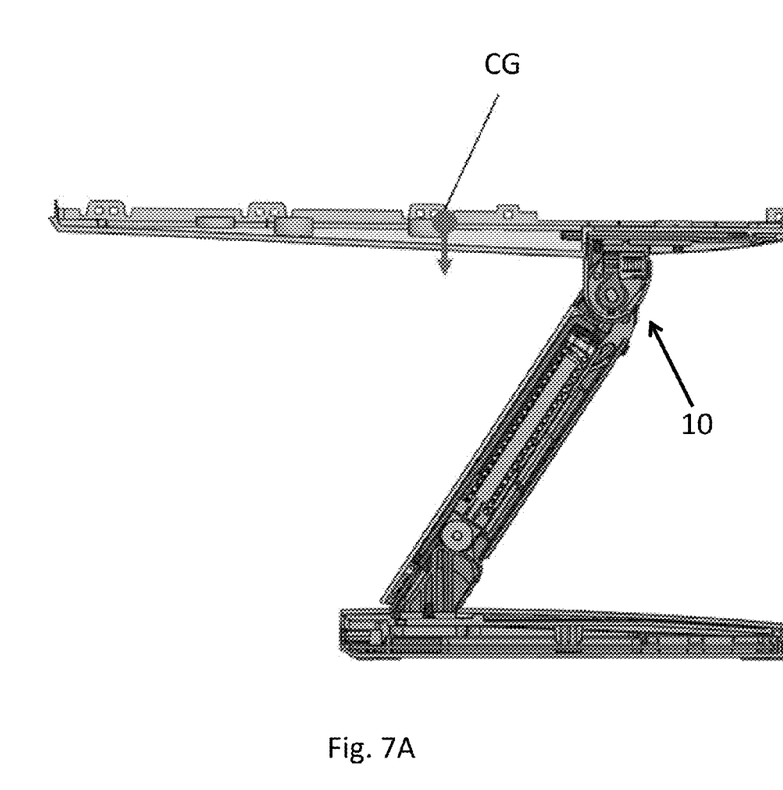
FIG. 7A includes a sectional side plan view of a stand with a tilt mechanism at a fourth tilt angle in accordance with an embodiment of the invention.
Figure 7B:
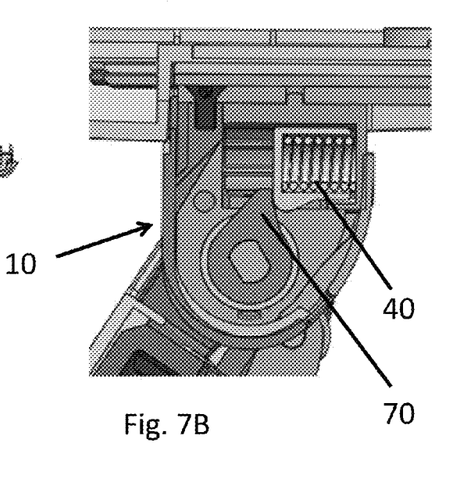
FIG. 7B includes an enlarged view of a portion of FIG. 7A.

In FIG. 7A, the tilt angle is approximately 90 degrees. As shown in the FIG. 7B, the compression spring 40 is at maximum compression to create a maximum spring torque to balance the maximum monitor torque.

Figure 8A:
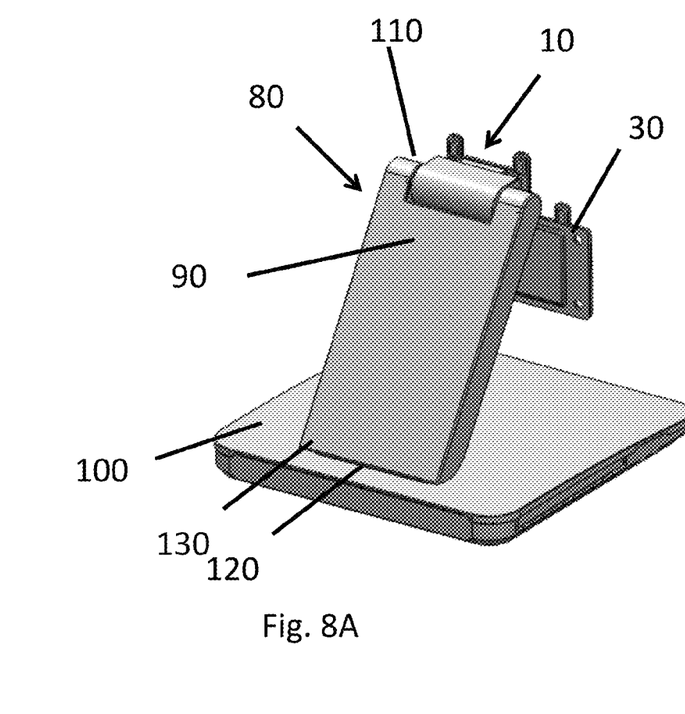
FIG. 8A includes a perspective view of a stand with a tilt mechanism in accordance with an embodiment of the invention.
Figure 8B:
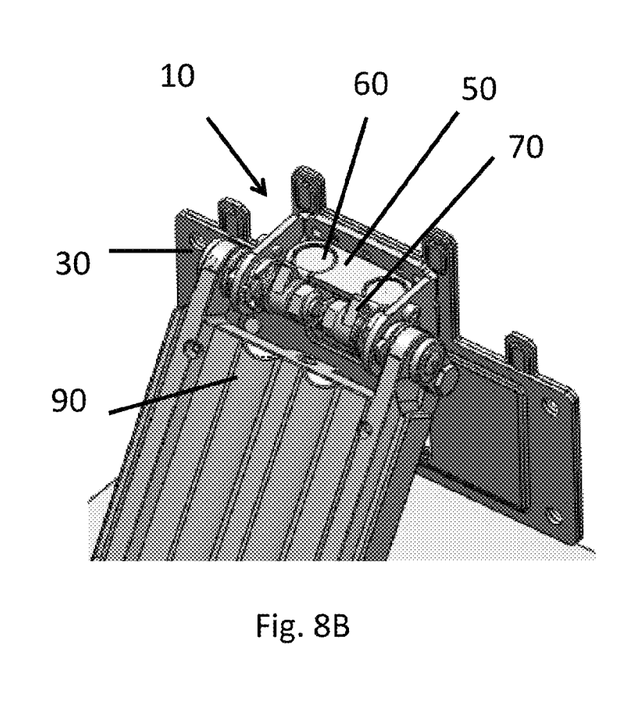
FIG. 8B includes an enlarged view of a portion of FIG. 8A with portions of a housing removed.
Figure 9A:
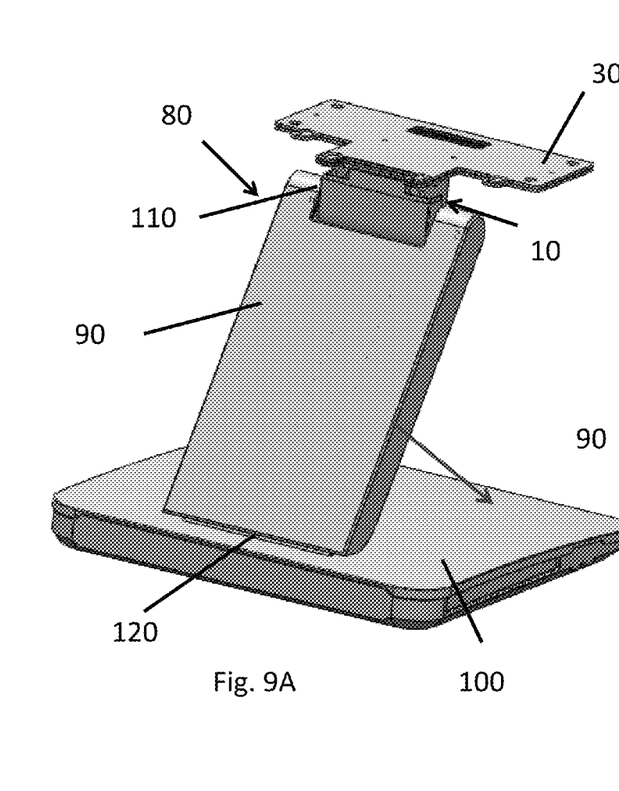
FIG. 9A includes a perspective view of a stand with a tilt mechanism at a tilt angle in accordance with an embodiment of the invention.
Figure 9B:
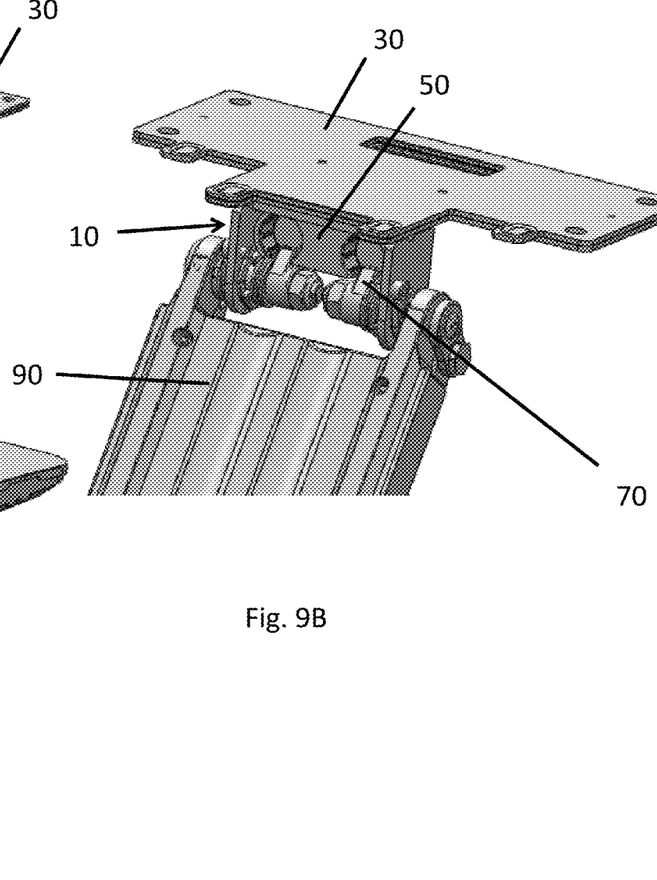
FIG. 9B includes an enlarged view of a portion of FIG. 9B with portions of a housing removed.

Embodiments of the tilt mechanism 10 described herein can be supported by any suitable support, such as a stand, arm, wall mount, or cart. In some embodiments, as shown in FIGS. 4A and 8A-10B, the support includes a stand 80 with a base 100 having a surface adapted to be in apposition to a horizontal support surface, such as a desk. As shown, the stand 80 includes the riser 90 having the distal end 110 connected to the monitor 20 via the tilt mechanism 10. As shown, in FIGS. 8-10, the tilt bracket 30 is pivotably attached to the distal end 110 of riser 90. In some embodiments the riser 90 is pivotable with respect to the base 100 about the base pivot 120 near its proximal end 130. As shown in FIG. 8-9, the stand 80 is pivoted at a first position. The riser 90 can be moved in a downward direction to fold the tilt mechanism 10. The riser 90 can be moved in a downward direction such that the stand 80 is generally horizontal or generally vertical.

Figure 10A:
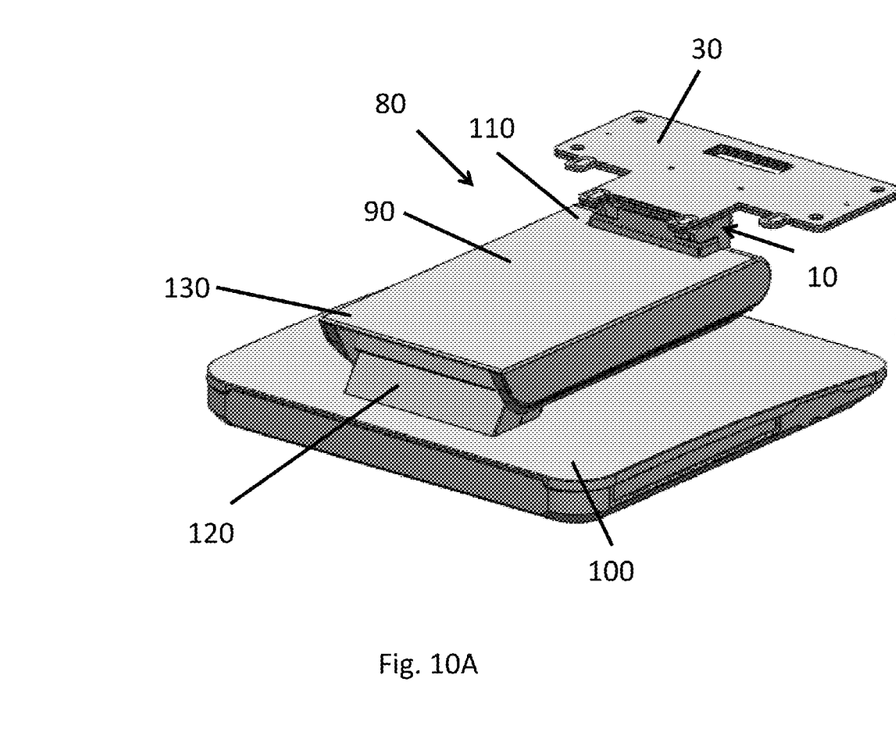
FIG. 10A includes a perspective view of a stand with a tilt mechanism at a tilt angle in accordance with an embodiment of the invention.
Figure 10B:
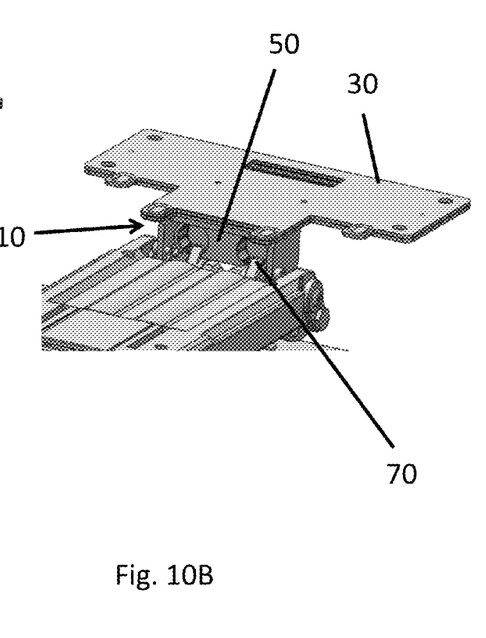
FIG. 10B includes an enlarged view of a portion of FIG. 10A with portions of a housing removed.

Referring now to FIG. 10A-10B, the stand 80 is pivoted at a second position by downward movement of the riser 90 from the first position. In the illustrated embodiment, the stand 80 is in a generally horizontal position. In this embodiment the monitor mounting bracket can be at its maximum tilt angle of 90 degrees. The riser can also house a counterbalance mechanism, such as a spring to balance the angular position of the riser with respect to the base. The low profile design of such an embodiment can minimize footprint of the tilt mechanism 10 during storage and transportation.

Embodiments of the invention also include methods of using any of the tilt mechanisms described herein. In some embodiments, the method includes providing a tilt mechanism with at least one compression spring and tilting the tilt mechanism to change a compression force of the compression spring.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention.

What is claimed is:

1. A tilt mechanism for a monitor, comprising:
    a support;
    a tilt bracket tiltable relative to the support about a tilt axis of rotation across a range of tilt angles; and
    a first compression spring having a first spring axis non-parallel with the tilt axis of rotation and positioned between the support and the tilt bracket to provide a spring torque acting against a monitor torque created by a monitor operably coupled to the tilt bracket,
    wherein an angle formed between the first spring axis and a display surface of the monitor remains constant across the range of tilt angles.

2. The tilt mechanism of claim 1, wherein the first compression spring can be configured to move between relatively uncompressed position and relatively compressed position when a compressive force is applied, the uncompressed position and the compressed position being spaced apart by a spring deflection distance along the first spring axis, so that the compression force increases as the spring deflection distance decreases.

3. The tilt mechanism of claim 1, wherein
    the monitor has a monitor weight and is disposed at a first distance from the tilt axis of rotation, the monitor torque increasing proportionally with the increase in first distance, and
    the spring axis being positioned at a second distance from the tilt axis of rotation, the spring torque increasing proportionally with the increase in the compression force.

4. The tilt mechanism of claim 1 wherein the tilt angle is between approximately −15 degrees and approximately 90 degrees.

5. The tilt mechanism of claim 4, wherein the spring torque is approximately equal to the monitor torque.

6. The tilt mechanism of claim 1, further comprising a spring holder bracket operatively connected to the tilt bracket, the spring holder bracket configured to provide a restraining support for the first compression spring.

7. The tilt mechanism of claim 1, further comprising a spring cap positioned adjacent a first end of the first compression spring such that the first compression spring exerts the compression force on the spring cap.

8. The tilt mechanism of claim 7, further comprising a compression bracket operably coupled to the spring cap, the angular position of the compression bracket remaining stationary with respect to the support, the first compression spring exerting the compression force on the compression bracket via the spring cap.

9. The tilt mechanism of claim 1, further comprising a second compression spring having a second spring axis parallel to the first spring axis, the second compression spring positioned between the support and the tilt bracket.

10. The tilt mechanism of claim 1, further comprising a monitor mounting bracket associated with the tilt bracket, the monitor mounting bracket supporting a monitor.

11. The tilt mechanism of claim 10, wherein the monitor mounting bracket is operatively connected to or integrally formed with the tilt bracket.

12. The tilt mechanism of claim 1, wherein the support includes
    a base,
    a riser pivotable about the base, the riser including a distal end and a proximal end,
    the distal end of the riser operably connecting to the tilt bracket of the tilt mechanism and the proximal end of the riser including a base pivot.

13. The tilt mechanism of claim 12, wherein the riser is pivotable with respect to the base pivot over a range of pivoting positions.

* * * * *